United States Patent [19]
Nishi et al.

[11] Patent Number: 5,379,784
[45] Date of Patent: Jan. 10, 1995

[54] APPARATUS FOR CLEANING CONVEYOR CHUCK

[75] Inventors: Mituo Nishi, Kurume; Naoki Shindou, Nirasaki; Kazuya Yamaguchi, Yame, all of Japan

[73] Assignees: Tokyo Electron Limited, Tokyo; Tokyo Electron Kyushu Limited, Tosu, both of Japan

[21] Appl. No.: 183,971

[22] Filed: Jan. 21, 1994

[30] Foreign Application Priority Data

| Jan. 23, 1993 | [JP] | Japan | 5-027553 |
| Aug. 20, 1993 | [JP] | Japan | 5-228136 |
| Dec. 27, 1993 | [JP] | Japan | 5-351269 |

[51] Int. Cl.⁶ .............................................. B08B 3/02
[52] U.S. Cl. .............................. 134/102.3; 134/104.1; 134/122 R; 134/199
[58] Field of Search ............. 134/104.1, 902, 102.3, 134/122 R, 199, 64 R; 294/1.1

[56] References Cited

U.S. PATENT DOCUMENTS

| 4,694,527 | 9/1987 | Yoshizawa | 134/902 |
| 5,224,593 | 7/1993 | Thompson et al. | 134/902 |
| 5,226,437 | 7/1993 | Kamikawa et al. . | |
| 5,253,663 | 10/1993 | Tanaka et al. . | |
| 5,261,431 | 11/1993 | Ueno et al. . | |
| 5,265,632 | 11/1993 | Nishi . | |

FOREIGN PATENT DOCUMENTS

| 61-153340 | 9/1986 | Japan . | |
| 64-12534 | 1/1989 | Japan | 134/902 |
| 2-44522 | 11/1990 | Japan . | |

*Primary Examiner*—Frankie L. Stinson
*Attorney, Agent, or Firm*—Oblon, Spivak, McClelland, Maier & Neustadt

[57] ABSTRACT

The chuck for conveying semiconductor wafers has a pair of swing arms. Each arm has lower horizontal rods provided with a plurality of grooves for holding wafers and with vertical rods sandwiching the horizontal rods between them. A chuck cleaning apparatus has a cleaning chamber in a casing. A partition plate extends along the center of the cleaning chamber to divide it into first and second compartments. The top of the cleaning chamber is closed by a shielding plate, which has a pair of openings through which the arms come into and out of the cleaning chamber. A washing liquid pipe is incorporated with the partition plate in a horizontal direction. A pair of drying gas pipes extend horizontally in each of the first and second compartments and they are positioned a little higher than the liquid pipe, sandwiching each arm between them. Each gas pipe has a plurality of gas jetting apertures which are divided into a first group to jet gas to the vertical rods and a second group to jet gas to the horizontal rods. The first group of the apertures are inclined downward in a vertical plane and directed to converge toward the vertical rod in a horizontal plane. The second group of the apertures are also inclined downward in the vertical plane and directed perpendicular to the horizontal rod in the horizontal plane.

20 Claims, 15 Drawing Sheets

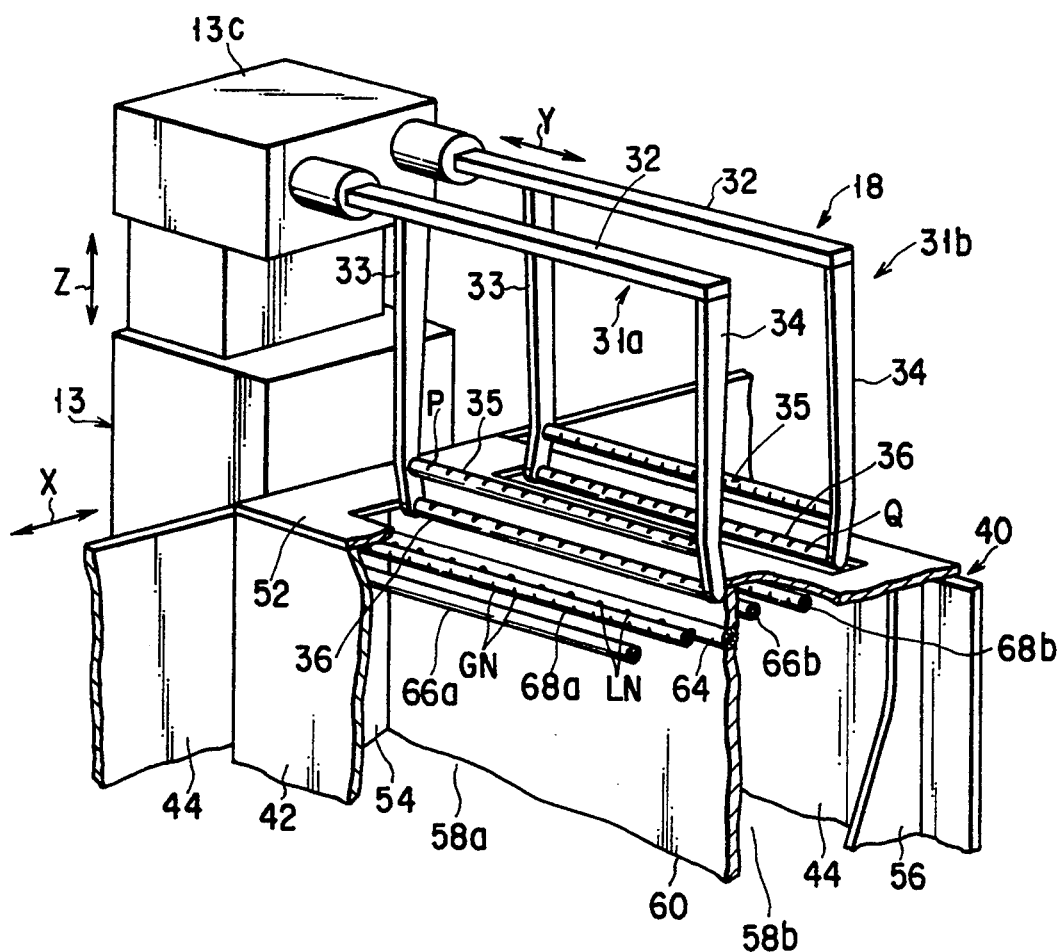
F I G. 2

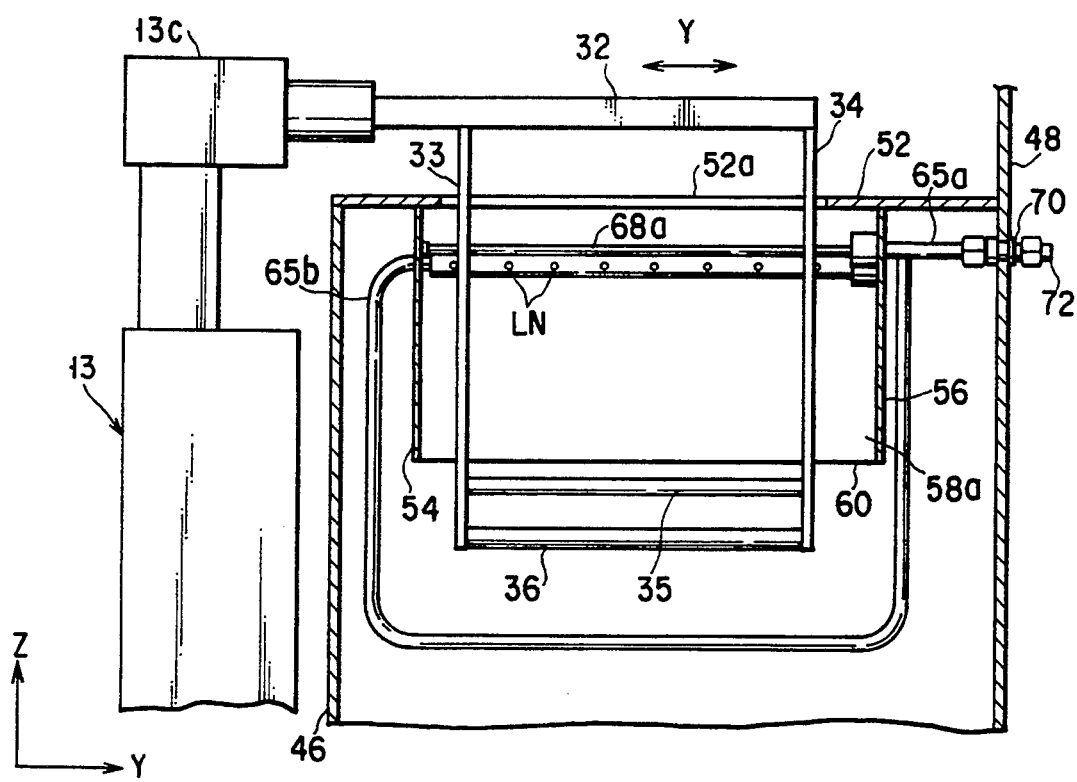
F I G. 3

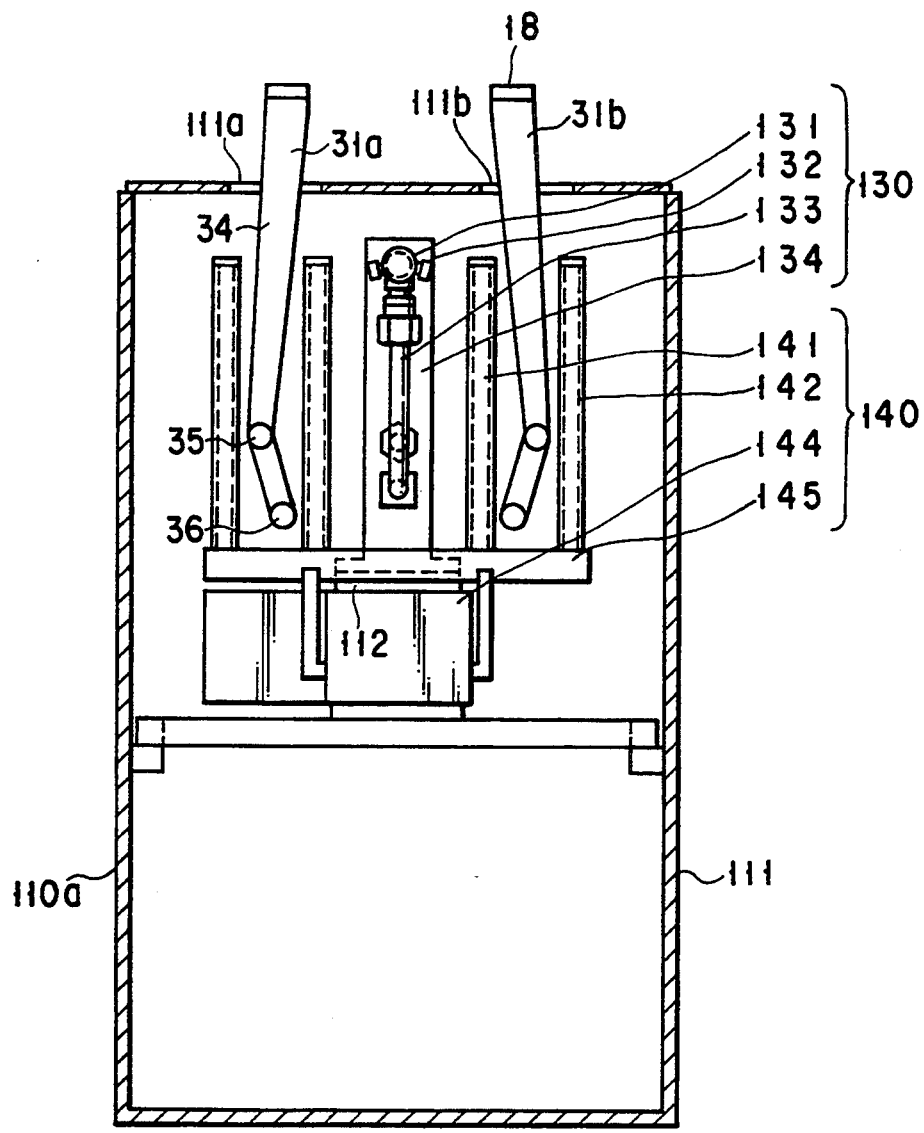
F I G. 9

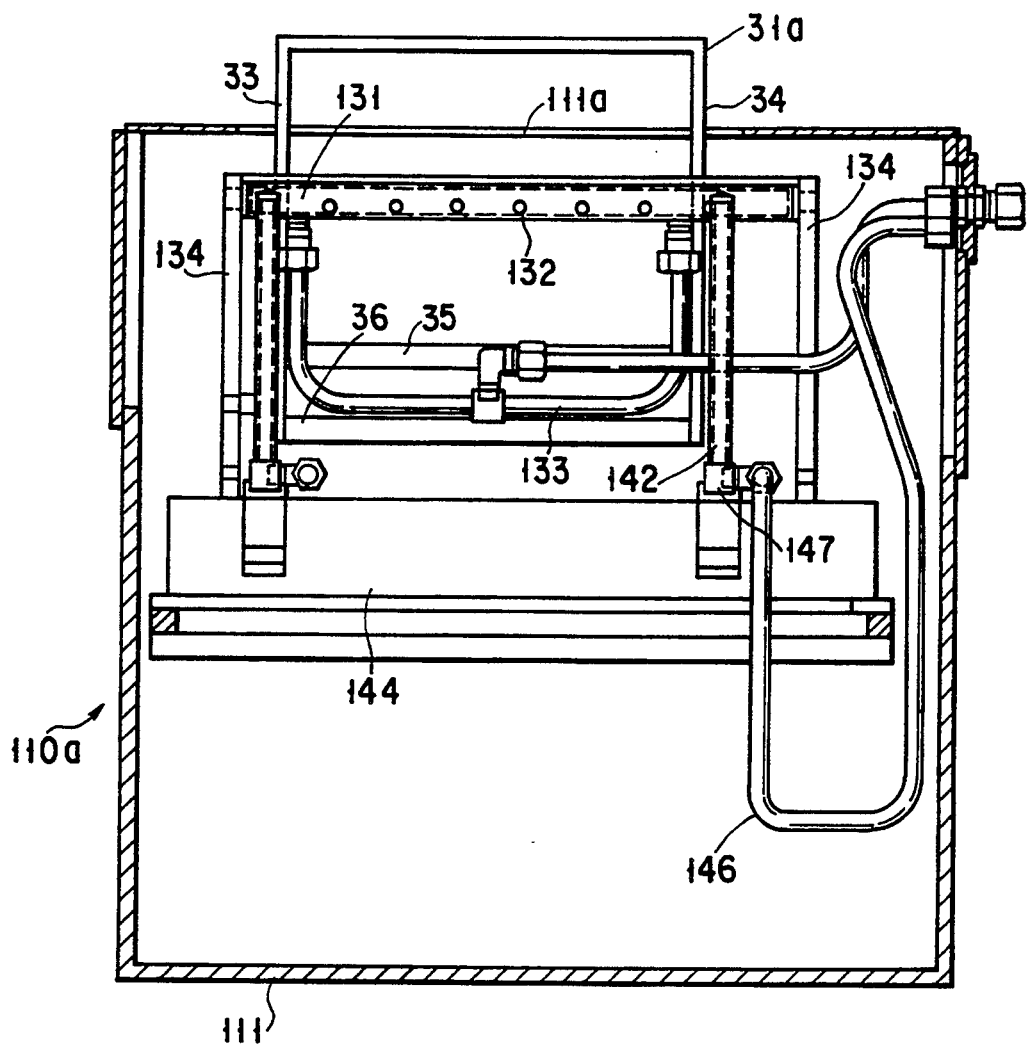
F I G. 10

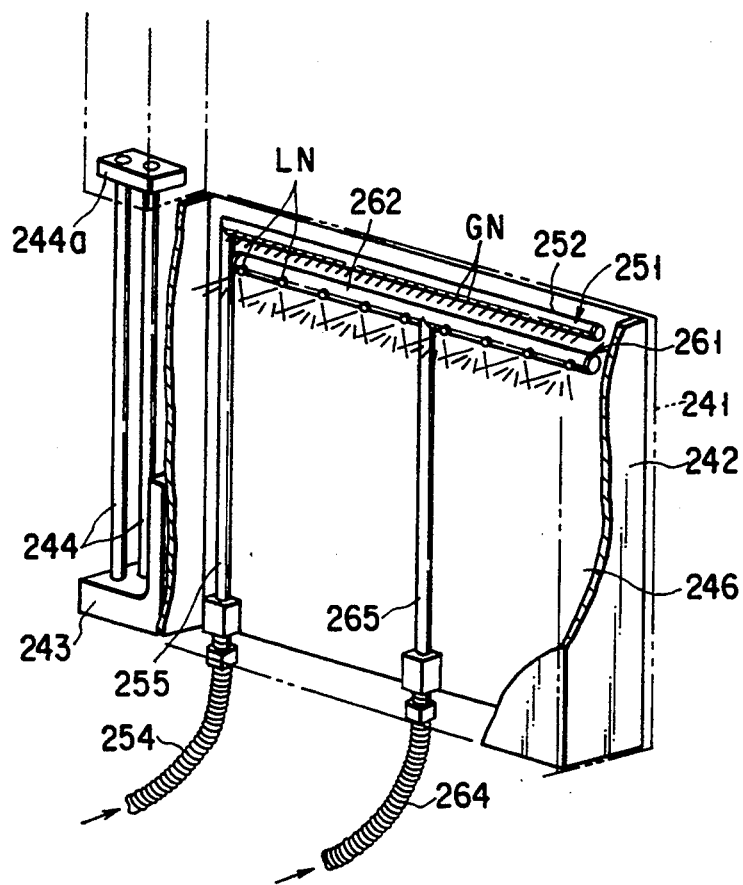
F I G. 18
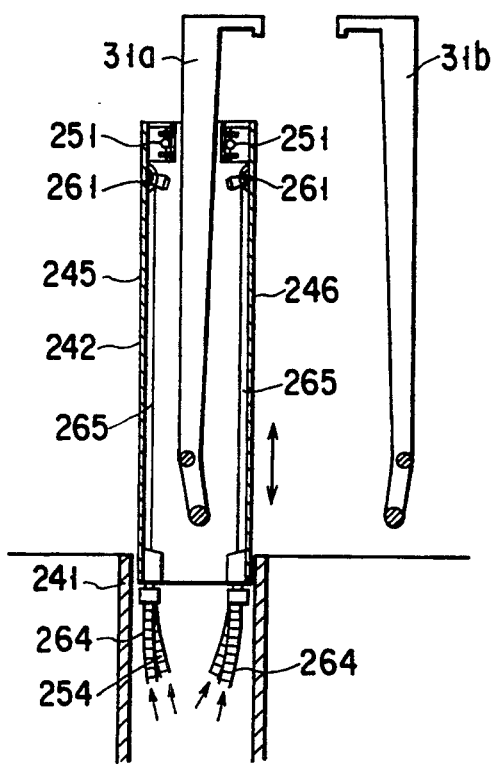
F I G. 19

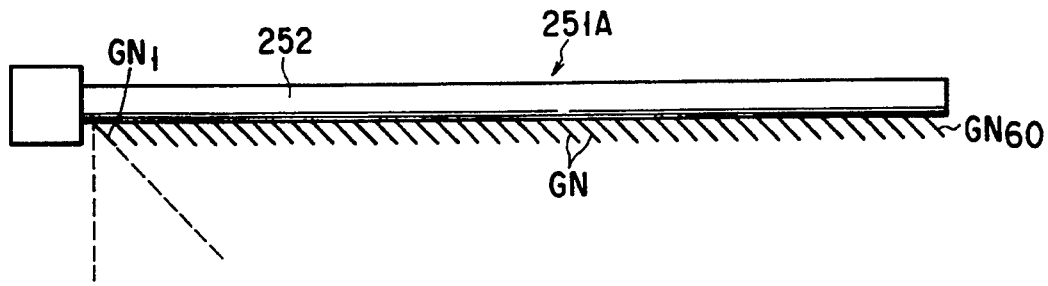
F I G. 20
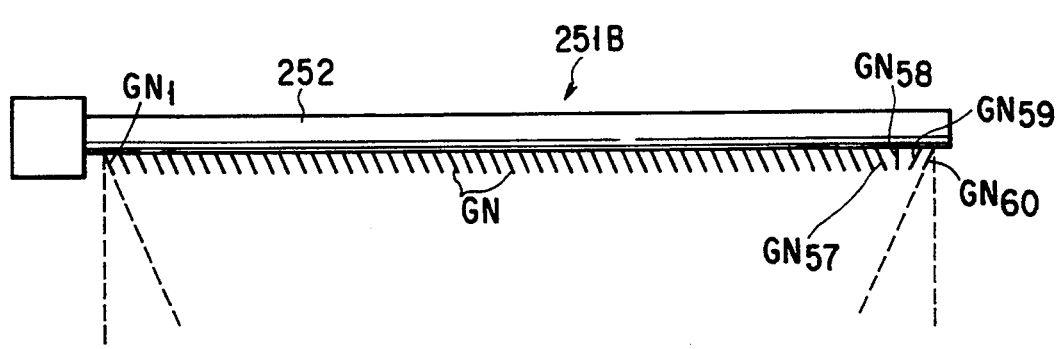
F I G. 21
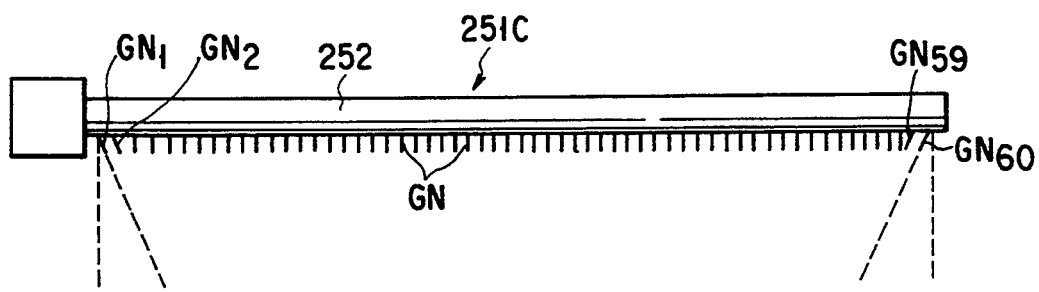
F I G. 22

APPARATUS FOR CLEANING CONVEYOR CHUCK

BACKGROUND OF THE INVENTION

1. Field of the Invention

The present invention relates to an apparatus for cleaning the conveyor chuck which carries a plurality of plate-like substrates such as semiconductor wafers to be processed while holding them together.

2. Description of the Related Art

The cleaning system has been used to remove particles, organic contaminating matters and metal impurities from surfaces of the semiconductor wafers in the course of manufacturing semiconductor devices. This cleaning system, particularly the wet cleaning system has been widely used as an important measure to effectively remove particles from the wafers in a batch. Usually, it comprises a loader unit into which plural carriers each housing a predetermined number of wafers therein are carried, conveyor robots each picking up and conveying a predetermined number of wafers from the carriers which have been loaded by the loader unit, plural cleaning sections arranged in a line to process the wafers carried as a batch with alkali, water and acid, and an unloader unit for unloading the wafers which have been cleaned in the cleaning sections.

When the wafers are to be cleaned, they are held by the wafer chuck of the conveyor robot and transferred into and out of process vessels in the cleaning sections. When the wafer chuck comes together with the wafers into and out of the process vessels in this manner, washing solutions or agents in the process vessels adhere to the wafer chuck and dusts such as particles floating in the cleaning sections also adhere to it even though they are quite small in amount. These solutions and particles contaminate it, thereby causing the wafers to be also contaminated and their electrical properties to be deteriorated accordingly. To solve this, the cleaning system has included a section for cleaning the wafer chuck. The wafer chuck is cleaned in the chuck cleaning section just before it conveys clean wafers. This is intended to convey the clean wafers by the cleaned wafer chuck.

Various kinds of chuck cleaning manner have been used. One of them is to immerse the chuck in extrapure water. The other is to jet extrapure water to the chuck. The former is intended to immerse the chuck in extrapure water in a process vessel to remove chemical solution and particles from it. The latter is intended to jet washing liquid such as extrapure water to the chuck through a plurality of jetting nozzles of paired liquid supply pipes which extend along the chuck while sandwiching it between them. Even if either of these two manners is used, however, washing solution or agent still stays in wafer holding grooves on arms of the chuck.

In a chuck cleaning apparatus disclosed in Published Unexamined Japanese Patent Application No. 61-153340, dry gas is Jetted to the chuck to dry it while blowing out washing solution still staying in the wafer holding grooves on arms of it by dry gas jetted. In this chuck cleaning apparatus, as shown in FIGS. 1 and 2 of the publication, a pair of gas supply pipes 52 are arranged on both sides of each arm 32 of the chuck, extending along the arm 32, and dry gas is horizontally jetted to the chuck through apertures of the gas supply pipes 52. When horizontal rods of each arm come side by side with the gas supply pipes 52, the chuck is stopped to dry the horizontal rods of its arm. In the case of this apparatus, however, the chuck drying speed is slow and washing solution cannot be completely removed from the horizontal rods of each arm.

Published Examined Japanese Patent Application No. 2-44522 discloses another apparatus intended to more effectively remove washing solution from the horizontal rods of arms of the wafer chuck. As shown in FIGS. 1 and 2 of the publication, this apparatus includes a pair of fixed gas nozzles 7 exclusively used for vertical rods 31a of each arm of the chuck and a pair of movable gas nozzles 10 exclusively used for horizontal rods 31b of each arm. Gas jetted through the paired movable gas nozzles 10 is directed to the horizontal rod but tilted toward an exhaust duct 40 along the horizontal rod. In this apparatus, too, the chuck cleaning speed is slow. In addition, the apparatus itsel becomes complicated.

SUMMARY OF THE INVENTION

The object of the present invention is therefore to provide a chuck cleaning apparatus capable of cleaning and drying the conveyor chuck with higher efficiency and accuracy.

According to the present invention, there is provided an apparatus for cleaning a conveyor chuck which includes first and second arms each having a lower traverse rod provided with a plurality of grooves for holding a plurality of plate objects at intervals in an erected state and also having an erect rod supporting the traverse rod, the apparatus comprising: elevator means for driving the conveyor chuck up and down while keeping the traverse rods of the first and second arms downward; a casing for providing a cleaning space therein and provided with a top opening in the top thereof through which the arms can be driven into and out of the cleaning space in the casing by the elevator means; first and second rows of discharge ports arranged between the arms in the casing and kept substantially horizontal to jet washing liquid to the first and second arms at first and second levels, respectively; means for supplying washing liquid to the first and second rows of discharge ports; third and fourth rows of discharge ports arranged between the arms in the casing and kept substantially horizontal to jet drying gas to the first and second arms at third and fourth levels above the first and second levels, respectively; and means for supplying drying gas to the third and fourth rows of discharge ports; wherein each of the third and fourth rows of discharge ports is divided into a first group positioned over the erect rod of each arm in a horizontal direction to be dedicated to the erect rod, and a second group to be dedicated to the traverse rod of the arm, the first group of discharge ports being inclined downward in a vertical plane and directed to substantially converge toward the erect rod in a horizontal plane, and the second group of discharge ports being inclined downward in a vertical plane and directed substantially perpendicular to the traverse rod.

BRIEF DESCRIPTION OF THE DRAWINGS

FIG. 2 is a perspective view showing a chuck cleaning section according to a first embodiment of the present invention partly dismantled;

FIG. 3 is a sectional side view showing the chuck cleaning section of FIG. 2 along a direction perpendicular to the longitudinal direction of the system shown in FIG. 1;

FIG. 9 is a sectional front view showing a chuck cleaning section according to a second embodiment of the present invention along the longitudinal direction of the system shown in FIG. 1, said chuck cleaning section being arranged in the system on the upstream side thereof;

FIG. 10 is a sectional side view showing the chuck cleaning section of FIG. 9 along a direction perpendicular to the longitudinal direction of the system shown in FIG. 1;

FIG. 18 is a perspective view showing the chuck cleaning section of FIG. 14 partly cut away;

FIG. 19 is a sectional front view showing the chuck cleaning section of FIG. 14; and FIGS. 20, 21 and 22 are plan views showing how gas jetting apertures of each gas spray are directed in the chuck cleaning section shown in FIG. 14.

DETAILED DESCRIPTION OF THE PREFERRED EMBODIMENTS

Figure 1:
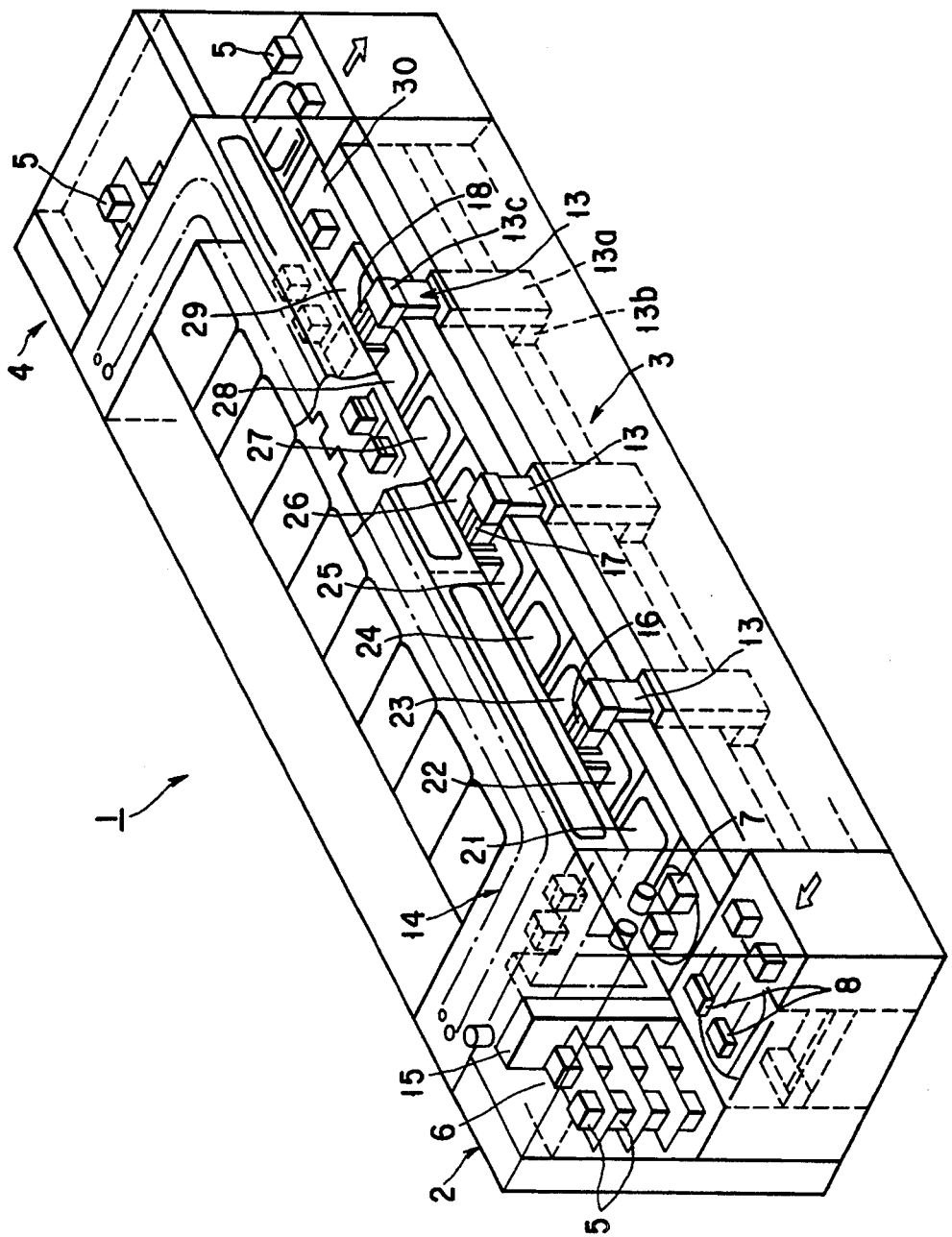
FIG. 1 is a perspective view showing a wafer cleaning system into which the chuck cleaning apparatus according to the present invention is incorporated as a chuck cleaning section.

A conveyor chuck cleaning apparatus according to the present invention is incorporated into a semiconductor wafers cleaning system 1 shown in FIG. 1, for example. This cleaning system 1 includes three zones comprising input, cleaning and output units 2, 3 and 4.

Carrier transferring device 8 is arranged in the input unit 2 to transfer wafer carriers 5 supplied from outside into it by a conveyor, for example. A predetermined number or twenty five sheets of wafers which are to be cleaned are housed in each of the carriers 5. The carriers 5 are transferred directly into the cleaning unit 3 by the transferring device 8. Or they are transferred into a storing section 6 by the device 8 and kept waiting there.

A loader section 7 is arranged in the cleaning unit 3 and adjacent to the input unit 2 to pick up wafers from the carrier 5, align their orientation flats with one another and detect the number of them. The carriers 5 kept in the storing section 6 are transferred from it into the loader section 7 by the transferring device 8. An unloader section 30 is also arranged in the cleaning unit 3 and adjacent to the output unit 4 to align the orientation flats of the wafers with one another, detect the number of them and insert them into the carriers 5. These carriers 5 are carried from the unloader section 30 into the output unit 4 by a transferring device which is arranged in the output unit 4.

Three wafer conveyor robots 13 are arranged along the front side of the cleaning unit 3 and a carrier cleaning line 14 runs along the top of the cleaning unit 3. Those empty carriers 5 from which the wafers have been picked up by the conveyor robot 13 which is arranged adjacent to the loader section 7 in the cleaning unit 3 are transferred to the carrier cleaning line 14 by the loader section 7 and a lifter 15.

A lifter (not shown) the same as the one 15 is also arranged in the output unit 4 and the empty carriers 5 which have arrived at the terminal of the carriers cleaning line 14 are set at predetermined positions in the unloader section 30 by the lifter.

A plurality of process sections each having a vessel made of quartz, for example, are arranged in a line in the cleaning unit 3. When starting from the side of loader section 7, they are a chuck cleaning section 21, a first chemical cleaning section 22, water cleaning sections 23, 24, a second chemical cleaning section 25, water cleaning sections 26, 27, a chuck cleaning section 28 and a drying section 29. The chuck cleaning section 21 is intended to clean and dry a wafer chuck 18 of that robot 13 which is arranged adjacent to the loader section 7; the first chemical cleaning section 22 to remove impurity matters such as organic and metallic contaminating particles from wafer surfaces by chemical solution; the water cleaning sections 23 and 24 to wash those wafers, which have been washed in the chemical cleaning section 22, by pure water, for example; the second chemical cleaning section 25 to wash them by chemical solution different from that in the first chemical cleaning section 22; the water cleaning sections 26 and 27 to wash them, which have been washed by the chemical cleaning section 25, by pure water, for example; the chuck cleaning section 28 to wash and dry a wafer chuck 18 of that conveyor robot 13 which is arranged adjacent to the unloader section 30; and the drying section 29 to dry those wafers, from which the impurity matters have been removed, by the vapor of IPA (isopropylalcohol). Chemical solutions over-flowed from the vessels in the chemical cleaning sections 22 and 25 are circulated and the impurity matters in these chemical solutions are removed from them while circulating them.

Each of the conveyor robots 13 has a lifter member 13a attached to a base 13b movable in that direction (or direction X) in which the process sections 21–29 are arranged. The lifter member 13a has a column movable and down (or in a direction Z). A chuck drive member 13c is attached to the top of the column to move the chuck 18 in a longitudinal direction (or a direction Y) of each of the process sections and also to swing it.

The wafer chuck 18 has a pair of arms 31a and 31b whose base ends are swingably attached to the front of the drive member 13c. The arms 31a and 31b are symmetrical to each other and each of them comprises an upper horizontal rod 32, vertical rods 33, 34 extending downward from both ends of the upper rod 32, and lower horizontal rods 35, 36 bridging the vertical rods 33 and 34 near and at the lower end portions thereof.

Each of the horizontal rods 35 and 36 has fifty grooves P or Q on it at a certain distance. When the arms 31*a* and 31*b* are swung inward to each other while seating the wafers in these grooves P and Q of the rods 35 and 36, the wafers can be thus firmly held between the arms 31*a* and 31*b*.

It will be described how the cleaning system 1 is operated.

When two carriers 5, in each of which twenty five sheets of semiconductor wafers have been housed, are supplied into the input unit 2, the transferring device 8 are made operative to transfer them into the loader section 7 at a time. Those carriers 5 which are supplied after then are carried into the storing section 6 by the transferring device 8 and temporarily stored there.

When these two carriers 5 are transferred into the loader section 7, fifty sheets of wafers in them are aligned and positioned of their orientation flats in a direction. At the same time, the conveyor robot 13 arranged upstream is made operative to position its wafer chuck 18 above the chuck cleaning section 21. The chuck 18 of the robot 13 is then cleaned and dried, as will be described later, and it is thus made ready for receiving the wafers in the loader section 7.

Fifty five sheets of wafers in two carriers 5 are lifted together by the loader section 7 and then held by the chuck 18 of the upstream-side robot 13, which is moved to the first chemical cleaning section 22 while holding the wafers by its chuck 18. The chuck 18 of the robot 13 is lowered into the process vessel in the chemical cleaning section 22 to transfer the wafers onto wafer supports (not shown) in the process vessel. The wafers are thus immersed and washed in chemical solution in the process vessel.

When the washing of wafers is finished in the first chemical cleaning section 22, the chuck 18 of the upstream-side robot 13 receives the wafers from the wafer supports and transfers them onto other wafer supports in the process vessel in the water cleaning section 23. They are thus washed by water in the process vessel in the section 23. They are then transferred into the process vessel in the water cleaning section 24 and similarly washed there by water. A first cleaning process is thus finished. The next intermediate conveyor robot 13 then transfer them to the second chemical and water cleaning sections 25, 26 and 27 while holding them by its chuck 18, and similar cleaning process is applied to them an process vessels in these sections. They are then transferred from the section 27 into the drying section 29 by the downstream-side robot 13 and dried there by the vapor of IPA.

After dried in this manner, they are housed in two empty carriers 5 in the unloader section 30. These two empty carriers 5 which are kept waiting in the section 30 have been cleaned and dried with no particles while passing through the carrier cleaning line 14. The cleaned waters housed in the carriers 5 are conveyed from the section 30 into the output unit 4 and then outside.

The chuck cleaning apparatuses according to the present invention are used in the chuck cleaning sections 21 and 28, respectively, and they are substantially the same in structure. Therefore, the one used in the section 28 will be described in detail below.

Figure 4:
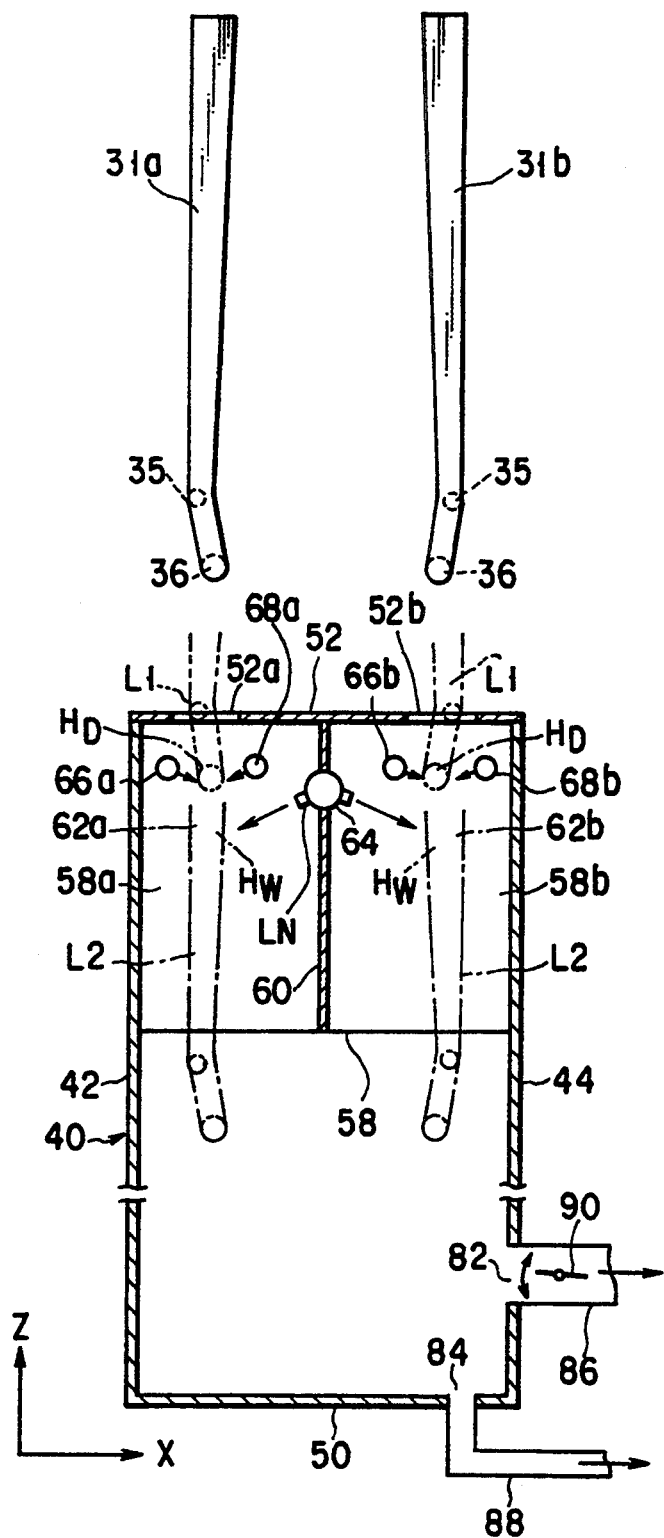
FIG. 4 is a sectional front view showing the chuck cleaning section of FIG. 2 along the longitudinal direction of the system shown in FIG. 1.
Figure 5:
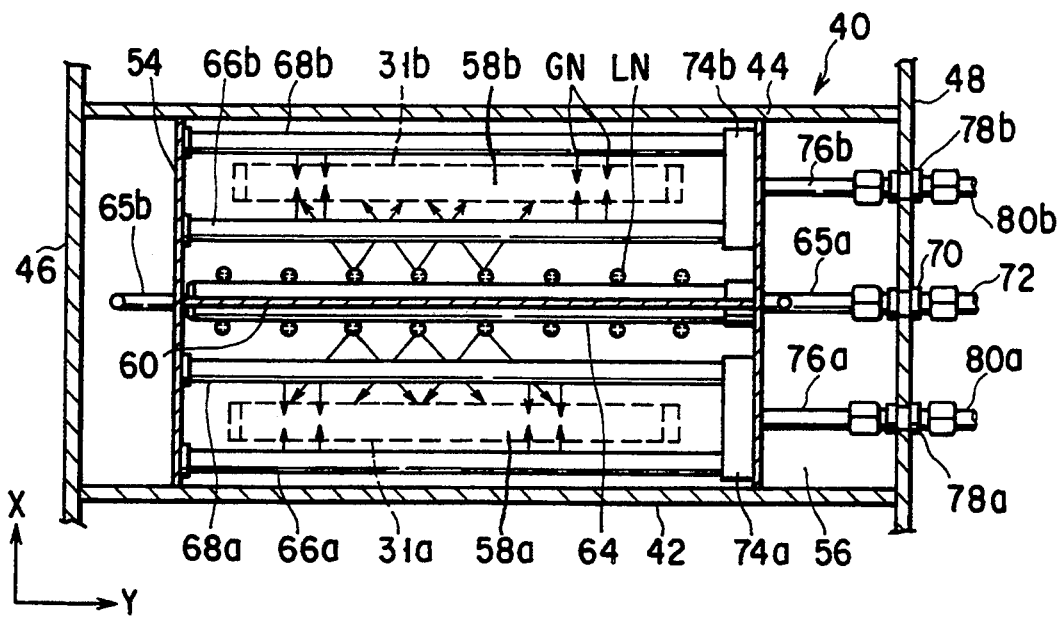
FIG. 5 is a sectional plan view showing the chuck cleaning section.

As shown in FIGS. 2 through 5, the chuck cleaning section 28 has a box-like casing 40. The casing 40 comprises a pair of side plates 42, 44, a pair of other side plates 46, 48 and bottom and top plates 50, 52. As shown in FIGS. 3 and 5, another pair of shielding plates 54 and 56 are arranged inside the side plates 46 and 48, having a certain interval between them, and fixed to the side plates 42 and 44. The shielding plates 54, 56, the side plates 42, 44 and the top plate 52 are combined with one another to form a cleaning chamber 58 whose bottom is opened. Further, the cleaning chamber 58 is partitioned, along the longitudinal center line, into first and second compartments 58*a* and 58*b* by a partition plate 60.

The top plate 52 shields the cleaning chamber 58 from outside and it has openings 52*a* and 52*b* through which the arms 31*a* and 31*b* of the chuck 18 can come into and out of the cleaning chamber 58. Spaces 62*a* and 62*b* for the arms 31*a* and 31*b* are formed just under the openings 52*a* and 52*b* of the top plate 52.

A pipe 64 through which washing liquid such as water is jetted into the arm spaces 62*a* and 62*b* and which is made integral to the partition plate 60 extends horizontally in the direction Y at the upper portion of the partition plate 60. A plurality of cylindrical nozzles LN are arranged at a certain interval and in a row, as shown in FIG. 4, on each of those sides of the pipe 64 which face the arm spaces 62*a* and 62*b*, respectively. As shown in FIGS. 4 and 5, each discharge port of these nozzles LN is inclined downward in a vertical plane perpendicular to the direction in which the rows extend and is directed to a washing position HW which has a certain level in each of the arm spaces 62*a* and 62*b*.

The pipe 64 are opened at both ends thereof and its base end is connected to a pipe 65*a* outside the shielding plate 56 while its front end to a pipe 65*b* outside the shielding plate 54, as shown in FIG. 3. The pipe 65*b* is connected to the pipe 65*a*, after it extends along the lower portion of the cleaning chamber 58. The pipe 65*a* is connected to an external pipe 72 through a connector 70 and then to a liquid supply source (not shown) through the pipe 72. The washing liquid is introduced from the supply source into the pipe 64, passing through the pipe 72, the connector 70 and the pipes 65*a*, 65*b*, and it is spreaded to the washing positions HW at an angle of 150 degrees, for example, through the nozzles LN.

Two pairs of liquid-removing gas pipes 66*a*, 68*a* and 66*b*, 68*b* extend horizontally in the direction Y in the first and second chambers 58*a* and 58*b*. They are positioned a little higher than the pipe 64. A plurality of gas jetting apertures GN are formed as a row in those sides of the paired pipes 66*a*, 68*a* and 66*b*, 68*b* which are opposed to each other, as shown in FIGS. 6 and 7.

Figure 6:
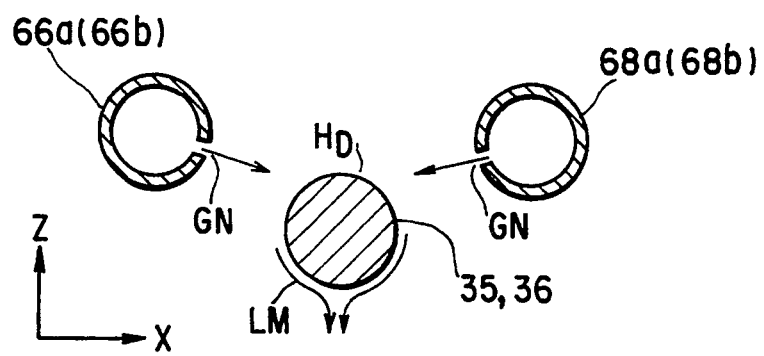
FIG. 6 is a sectional front view showing how gas jetting apertures of each gas pipe are directed in the chuck cleaning section shown in FIG. 2.
Figure 7:
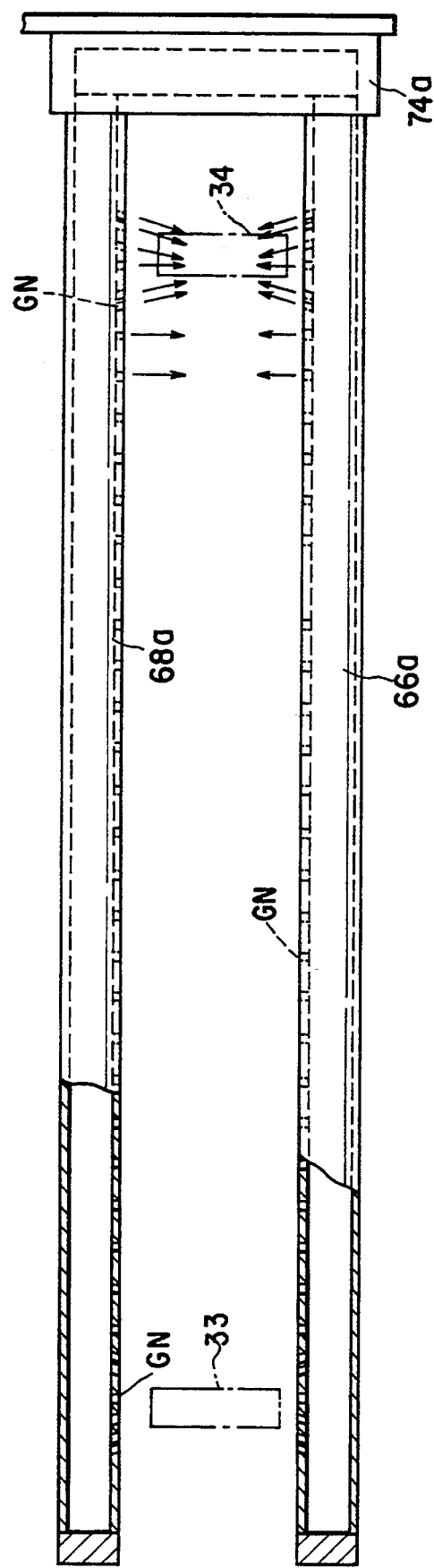
FIG. 7 is a sectional plan view showing how the gas jetting apertures of the gas pipes are directed in the chuck cleaning section shown in FIG. 2.

As shown in FIG. 6, each of the gas jetting apertures GN is inclined downward in a vertical plane perpendicular to the direction in which the rows extend, and is directed to a liquid-removing position HD higher than the cleaning position HW, as shown in FIGS. 4 and 6. They are more in number at both ends of each gas pipe and these apertures at both ends of each gas pipe are tilted and directed to the vertical rods 33 and 34 of the arms 31*a* and 31*b*, as shown in FIG. 7. Gas can be thus effectively jetted to outer circumferences of the vertical rods 33, 34 and also to junctions of the vertical and horizontal rods 33, 34 and 35, 36 to thereby remove liquid from them. In FIG. 7, arrows extend from some gas jetting apertures GN to make it easy to understand how the apertures GN are directed in the horizontal plane.

Both base ends of the gas pipes 66*a* and 68*a* in the first compartment 58*a* are opened and connected to a gas introducing buffer chamber 74*a*. The other front ends thereof are closed and fixed to the shielding plate 54.

The buffer chamber 74a is connected to an external pipe 80a through a pipe 76a and a connector 78a outside the shielding plate 56 and then to a gas supply source (not shown) through the pipe 80a. Gas such as air, for example, is introduced from the gas supply source into the buffer chamber 74a through the pipe 80a, the connector 78a and the pipe 76a. It is then supplied into the paired gas pipes 66a and 68a and jetted to the liquid-removing position HD in the first compartment 58a through the gas jetting apertures GN of these pipes.

Same thing can be said about the paired gas pipes 66b and 68b in the second compartment 58b. Air is introduced from the gas supply source into a buffer chamber 74b through a pipe 80b, a connector 78b and a pipe 76b. It is then supplied into the paired gas pipes 66b and 68b and jetted to the liquid-removing position HD in the second compartment 58b through the gas jetting apertures GN of these pipes.

Gas and drain exhausting openings 82 and 84 are arranged adjacent to the bottom of the casing 40, as shown an FIG. 4. The gas exhausting opening 82 is connected to an exhaust pump (not shown) through an exhaust pipe 86. The drain exhausting opening 84 is connected to a drain tank (not shown) through an exhaust pipe 88. An exhaust damper 90 is arranged in the exhaust pipe 86.

It will be described how the chuck cleaning section 28 is operated.

When the wafer chuck 18 is to be cleaned, it is transferred to the cleaning section 28 without holding the wafers W thereon, as shown in FIG. 2. Its arms 31a and 31b are made substantially parallel to each other and positioned just above the openings 52a and 52b in the top plate 52 of the casing 40 by the drive member 13c. The lifter member 13a of the robot 13 is made operative under this state to lower the drive member 13c together with the chuck 18. The arms 31a and 31b are thus forced to vertically enter into the first and second chambers 58a and 58b through the openings 52a and 52b as shown by broken lines L1 in FIG. 4 and then as shown by dot and dash lines L2 in FIG. 4.

The washing liquid is jetted to the washing positions HW in the first and second compartments 58a and 58b through the nozzles LN of two rows on both sides of the pipe 64. Air is also jetted to the liquid-removing positions HD in the first and second compartments 58a and 58b through the gas jetting apertures GN of the paired gas pipes 66a, 68a and 66b, 68b.

Therefore, air is jetted at first to the arms 31a and 31b at the liquid-removing positions HD in the first and second compartments 58a and 58b through the gas jetting apertures GN when the arms 31a and 31b are on the way of entering into the arm spaces 62a and 62b in the first and second compartments 58a and 58b through the openings 52a and 52b. The washing liquid is then jetted to them at the washing positions HW in the first and second compartments 58a and 58b through the liquid jetting nozzles LN. A part or most of process solution or agent and particles adhering to them can be washed out by washing liquid thus jetted.

When the arms 31a and 31b are lowered to positions shown by dot and dash lines L2, the lifter member 13a of the robot 13 lifts the chuck 18 upward to pull the arms 31a and 31b of the chuck 18 out of the first and second compartments 58a and 58b. While lifting the arms 31a and 31b upward in this manner, process solution or agent and particles remaining to them are again washed out from them at the liquid-removing positions by washing liquid jetted. Just after then, air knives jetted through the gas jetting apertures GN remove washing liquid from them at the liquid-removing positions HD in the first and second compartments 58a and 58b. They have been therefore made clean and dry when they are pulled outside the first and second compartments 58a and 58b.

Washing liquid falling on the bottom of the casing 40 is introduced into the drain tank, passing through the drain exhausting opening and pipe 84 and 88. Clean air is also supplied downward from above the cleaning section 28 into the cleaning chamber 58 and this air entering into the first and second compartments 58a and 58b through the openings 52a and 52b is exhausted outside the casing 40, passing through the air exhausting opening and pipe 82 and 86.

As described above, the gas jetting apertures GN of each gas pipe are directed downward, when viewed in a plane substantially perpendicular to the plane along which they extend, to jet gas to the liquid-removing position HD. When the horizontal rods 35 and 36 of each arm pass through the liquid-removing position HD while being lifted upward, therefore, liquid drops adhering to them can be blown off from them due to downward air knives thus created through the gas jetting apertures GN, running along their outer circumferences as shown by arrows LM in FIG. 6, that is, running the shortest distance. This enables each of the arms 31a and 31b to be more effectively and fully dried for a shorter time just after washing liquid is jetted to each of them. It is therefore effective from this viewpoint that those gas jetting apertures of each gas pipe which are arranged at the center portion of the gas pipe are directed downward.

Further, the cleaning chamber 58 is divided into the first and second compartments 58a and 58b which are shielded from the other by the center partition plate 60. The arms 31a and 31b can be therefore washed and dried at the same time but independently of the other. This prevents contaminating matters adhering to them from being scattered around. In addition, these matters can be surely guided downward.

Although the arms 31a and 31b are washed and dried at the same time in the above-described case, one of them can be washed and dried while leaving the other not processed. In other words, they can be alternately washed and dried. When arranged in this manner, they can be also similarly washed and dried even if the amount of liquid-removing gas supplied is small. Namely, the gas pipes 66a, 68a and 66b, 68b to which gas is supplied are selectively changed by switching means such as air operation valves. More specifically, the arm 31a is washed and dried in the first chamber 58a and the other arm 31b is then washed and dried in the second chamber 58b. When they are alternately processed in this manner, gas pressure can be made two times higher to more effectively remove liquid drops from them.

When the arm 31b is to be washed and dried in this case, the other arm 31a which has been washed and dried must be lowered together with the arm 31b into the chamber 58. However, the first and second compartments 58a and 58b are shielded from the other by the partition plate 60. This prevents washing liquid jetted to the arm 31b from being splashed over the other arm 31a.

It may be arranged that the liquid pipe having the nozzles LN is arranged in each of the first and second compartments 58a and 58b. Single washing and drying operation can be made easier and liquid pressure can be made two times higher in this case.

Each of the first and second compartments 58a and 58b may have not a pair of the gas pipes but a single gas pipe. Or it may have plural pairs of the gas pipes.

The cleaning chamber 58 is shielded from outside by the shielding plate 52. This enables chemical solution vessels and others to be arranged adjacent to the chuck cleaning apparatus of the present invention.

Furthermore, the arms 31a and 31b may be repeatedly reciprocated by a distance, which corresponds to the interval between two adjacent apertures GN, in the direction Y along which the gas jetting apertures GN of each row extend. When they are repeatedly reciprocated in this manner, gas jetted through the apertures GN can be uniformly applied to all over them. This enables the liquid-removing effect to be similarly achieved even if the number of gas jetting apertures GN used is made smaller.

Figure 8:
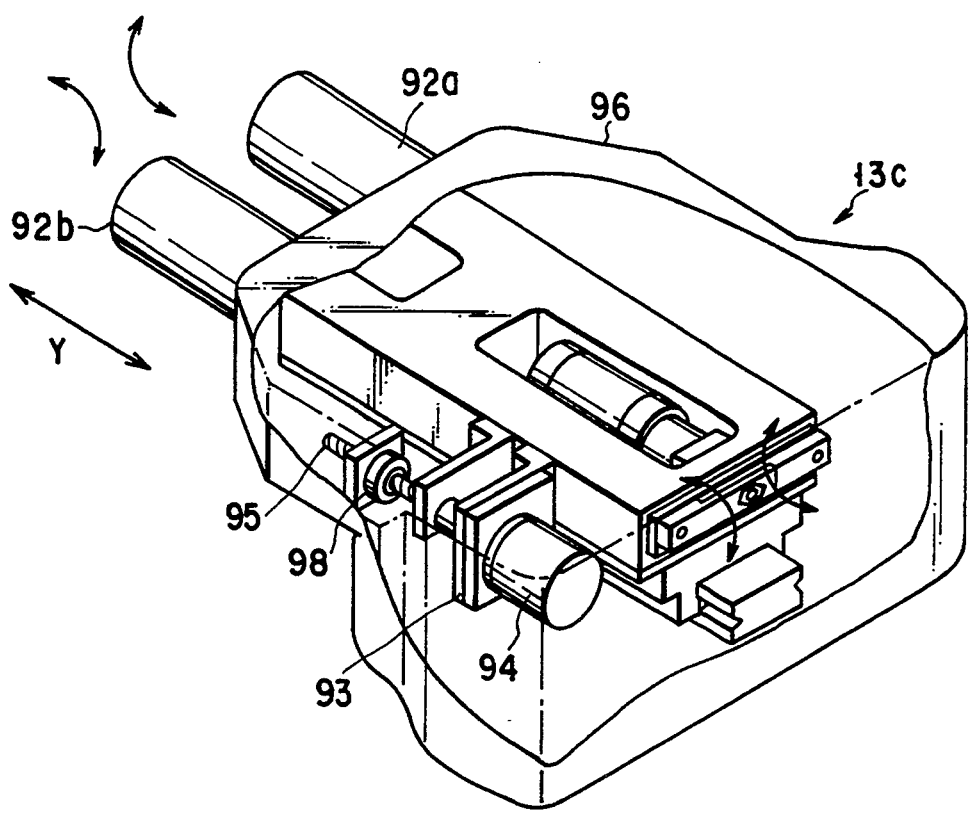
FIG. 8 is a perspective view showing an Y-axis drive unit in the chuck drive member partly dismantled.

FIG. 8 shows a mechanism arranged in the drive member 13c to reciprocate the arms 31a and 31b as described above. Base end portions of paired arm drive shafts 92a and 92b are made integral to each other while front end portions thereof are connected to the horizontal rods 32 of the chuck 18, respectively. A ball screw 95 is connected to the motor drive shaft of a Y-axis drive motor 94 which is fixed to the arm drive shafts 92a and 92b through a support 93, and a ball nut 98 which is fixed to a chuck base 96 is screwed onto the ball screw 95. When the Y-axis drive motor 94 is rotated, it is moved forward or backward together with the arm drive shafts 92a and 92b in the direction Y, depending upon what direction it is rotated in. The extent to which they are reciprocated forward and backward depends upon the angle of the motor 94 rotated.

When the arms are to be washed and dried in this case, the Y-axis drive motor 94 can be rotated forward and backward at a certain angle according to a previously set program. The arm drive shafts 92a and 92b or the arms 31a and 31b can be thus reciprocated by a predetermined stroke.

The chuck cleaning apparatus according to a second embodiment of the present invention will be described referring to FIGS. 9 through 13. This second embodiment is also incorporated, as a wafer chuck cleaning section, into the cleaning system 1 as seen in the case of the first embodiment described above.

A chuck cleaning section 110a according to a second embodiment of the present invention is arranged in the cleaning system 1 on the upstream side thereof. As shown in FIG. 9, it includes a rectangular casing 111 and a base 112 arranged in the casing 111. Arranged on the base 112 are means 130 for jetting washing liquid such as extrapure water and means 140 for jetting dry air. The casing 111 has in its top two slits 111a and 111b through which the arms 31a and 31b of the wafer chuck 18 can come into and out of the casing 111.

The liquid jetting means 130 has a liquid pipe 131, which is arranged between the arms 31a and 31b, extending in the direction Y to cover the length of each horizontal rod of the chuck 18, and which is made of synthetic resin such as hard PVC. The liquid pipe 131 is supported at its both ends by support members 134 which are erected from the base 112. It is positioned a little lower than the top of the casing 111, horizontally extending along the top of the casing 111. A U-shaped liquid supply pipe 133 is connected from below to the pipe 131 at both ends thereof and extrapure water is supplied from a water supply source (not Shown) into the pipe 131 through the supply pipe 133.

A plurality of liquid jetting nozzles 132 made of synthetic resin such as PCTFE are symmetrically arranged on both sides of the pipe 131. They are directed downward from the pipe 131, as shown in FIG. 9. Extrapure water can be therefore jetted obliquely and downward through the nozzles 132 to effectively blow out washing agent or solution and contaminating matters such as particles downward from the vertical and horizontal rods 33, 34 and 35, 36 of each arm. Water thus used is exhausted outside through a drain opening (not shown) which is formed in the bottom of the casing 111.

Figure 11:
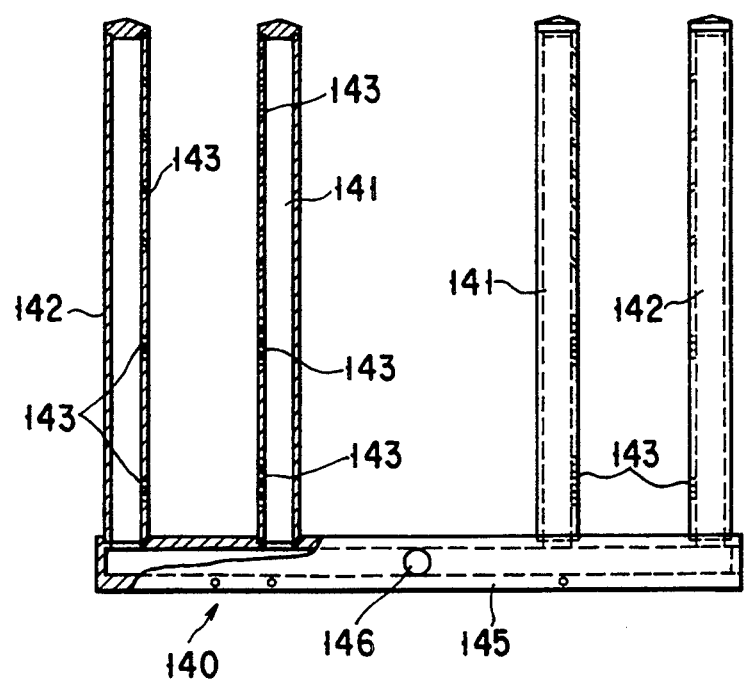
FIG. 11 is a sectional front view showing gas supply means for the chuck cleaning section shown in FIG. 9.
Figure 12:
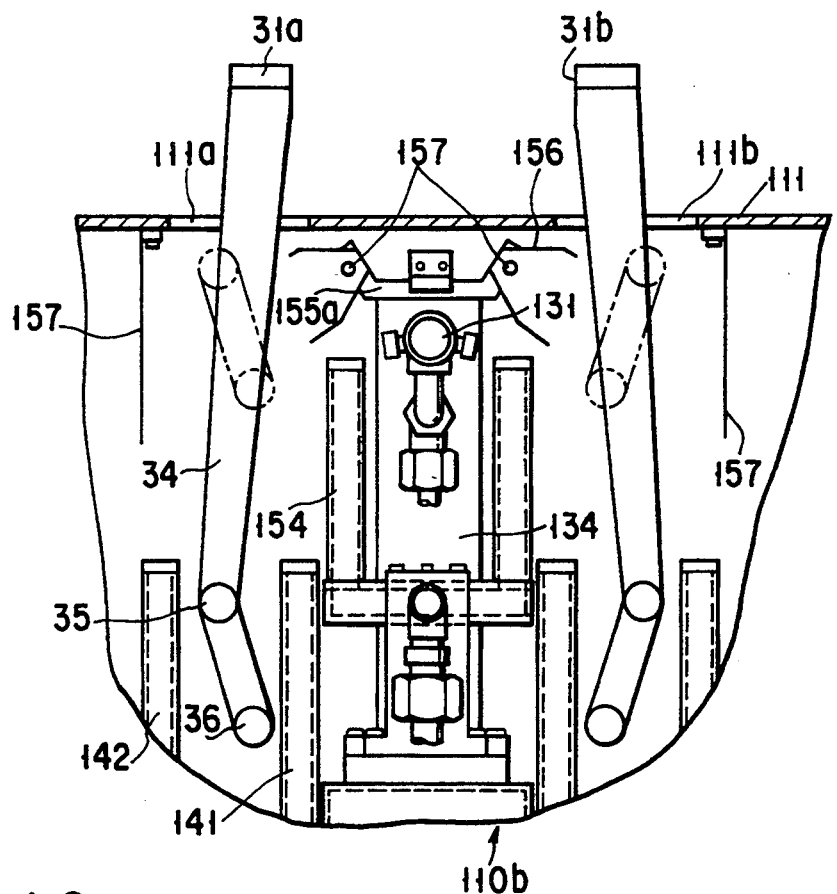
FIG. 12 is a sectional front view showing a downstream-side chuck cleaning section according to the second embodiment of the present invention.

The gas jetting means 140 includes two pairs of gas pipes 141 and 142 wherein one pair of the pipes 141 and 142 are arranged to sandwich the vertical rod 33 of each arm between them while the other to sandwich the vertical rod 34 of the arm between them, as shown in FIGS. 9 through 11. They are vertically erected and made of synthetic resin such as hard PVC. A plurality of gas jetting apertures 143 are arranged like a row in each of them.

The gas pipes 141 and 142 are supported on a drive member 144 by which they can be together moved forward and backward along the horizontal rods 35 and 36 of each arm. When the arms 31a and 31b are lowered into the casing 111 to a predetermined depth and kept stationary there, the gas pipes 141 and 142 are together reciprocated to jet dry air to the vertical and horizontal rods 33, 34 and 35, 36 of each arm.

As shown in FIGS. 9 and 10, two pairs of the gas pipes 141 and 142 which sandwich the vertical rods 33 of the arms 31a and 31b between them are connected to each other by a communication pipe 145. As shown in FIG. 11, the communication pipe 145 is closed at both ends thereof and dry air is supplied from an air supply source (not shown) into it through a pipe 146 connected from below to the center of it. As shown in FIG. 10, it is connected to a belt (not shown) of a drive member 144 through a connecting member 147 and it is reciprocated forward and backward in the casing 111 by the drive member 144.

The number of the gas jetting apertures which are formed in each of the gas pipes 141 arranged between the arms 31a and 31b is different from that in each of the gas pipes 142 arranged respectively outside the arms 31a and 31b. In short, the number of the gas jetting apertures in each pipe 141 is made larger than that in each pipe 142. This is because the gas jetting apertures 143 in each pipe 141 face directly to the wafer holding grooves P and Q on the horizontal rods 35 and 36 of each arm.

The gas pipes 141 and 142 will be further described in more detail with reference to FIG. 11. In the case of the gas pipes 141 arranged between the arms 31a and 31b, the apertures 143 are made more in number at two upper and lower portions of each pipe 141 to horizontally jet dry air to the horizontal rods 35 and 35 of each arm. This enables dry air to be concentratedly jetted to the horizontal rods 35 and 36 of each arm through these densely-arranged apertures 143 of each gas pipe 141. The other gas Jetting apertures 143 formed mainly in that portion of each pipe 141 which is higher than the horizontal rod 35 have a larger interval between adjacent ones. As the result, dry air can be jetted also all over the vertical rods 33 and 34 of each arm through the densely- and thinly-arranged gas jetting apertures 143 of the gas pipes 141.

In the case of the gas pipes 142 arranged outside the arms 31a and 31b, each of them has the same gas jetting apertures 143 as those of the gas pipe 141, but the apertures 143 at those portions of it which face the horizontal rods 35 and 36 of each arm are less densely arranged. In short, that area of each gas pipe 142 where the apertures 142 are densely arranged corresponds to the lower half of that area of each gas pipe 141 where the apertures 143 are densely arranged. In addition, the apertures 143 at other portions of each gas pipe 142 have a larger interval between two of them.

In the case of the gas jetting means 140, therefore, the gas jetting apertures 143 of each gas pipe 141 are different in number from those of each gas pipe 142. The amount of dry air Jetted through the gas pipes 141 are thus made different from that of dry air jetted through the gas pipes 142. In other words, flows of dry air jetted through the gas pipes 141 and 142 are not offset each other to thereby effectively dry the arms 31a and 31b.

The above-described chuck cleaning section 110a is suitable for its being arranged in the cleaning system 1 on the upstream side thereof. Another chuck cleaning section 110b which is preferably arranged in the cleaning system 1 on the downstream side thereof is substantially the same in structure as the chuck cleaning section 110a, but it is different in a few points from the latter.

In the case of the chuck cleaning section 110b, two infrared ray heaters 150 are arranged obliquely above the liquid pipe 131 on left and right sides thereof, extending along the top of the casing 111 from the front end to the back end thereof. Further, the gas pipes 141 and 142 are shorter than those in the chuck cleaning section 110a and additional gas pipes 154 are therefore arranged between the arms 31a and 31b to additionally jet dry air to the arms 31a and 31b. The infrared ray heaters 155 are intended to further completely dry the arms 31a and 31b which have been dried by the gas jetting means 140 in the chuck cleaning section 110a. No pure water is thus left on the chuck to adhere to the wafers which have been cleaned.

Reflectors 156 are attached to each of the infrared ray heaters 155. In addition, a shielding plate 157 hungs from the top of the casing 111 to stop the scattering of infrared rays emitted from its corresponding infrared ray heater 155. The arms 31a and 31b can be thus more firmly dried by infrared rays and the above-described arrangement of the reflectors 156 and the shielding plates 157 can prevent any other components in the chuck cleaning section 110b from being abnormally heated. Each of the infrared ray heaters 155 is supported at both ends thereof by a support 155a which is supported by the support 134.

It will be described how the chuck cleaning apparatus according to the second embodiment of the present invention is operated in the chuck cleaning sections 110a and 110b.

The conveyor robot 13 is driven and the arms 31a and 31b are thus quickly lowered into the casing 111 to the predetermined lower end position through the slits 111a and 111b of the casing 111 and then slowly lifted. As they are lifted, extrapure water is jetted obliquely and downward through two rows of the nozzles 132 on left and right sides of the pipe 131 to blow out process solution drops and particles from the horizontal rods 35 and 36 of the arm 31a and 31b and also from the vertical rods 33 and 34 thereof. When the arms 31a and 31b are lifted in the casing 111 to the predetermined upper end position, they are again quickly lowered in the casing 111 to the lower end position and kept stationary there. The gas jetting means 140 is then made operative.

While jetting dry air through the gas jetting apertures 143, the gas pipes 141 and 142 are reciprocaterd forward and backward several times in the casing 111. Extrapure water adhering to the vertical rods 33 and 34 of the arms 31a and 31b which have been washed by extrapure water is blown out from them in this while by dry air thus jetted. Extrapure water adhering to the horizontal rods 35 and 36 thereof which have been washed by extrapure water is also blown out from them by dry air jetted. The arms 31a and 31b are thus quickly dried while removing liquid from the rods 33, 34, 35 and 36 in this manner. Dry air is concentratedly jetted to the grooves-provided horizontal rods 35 and 36 through the densely-arranged apertures of the inner gas pipes 141 because extrapure water is likely to stay in the wafers holding grooves P and Q of the horizontal rods 35 and 36. At the same time, dry air is also jetted from above to the wafers holding grooves P and Q of the rods 35 and 36 through the thinly-arranged apertures of the gas pipes 141 and 142 to remove liquid from them. Dry air jetted flows downward along the vertical rods 33 and 34 to remove extrapure water from them while forcing it downward along them. The arms 31a and 31b can be thus completely dried.

In the chuck cleaning section 110b arranged downstream, the arms 31a and 31b which have been dried by the gas jetting means 140 are further heated and dried by infrared rays emitted from the infrared ray heaters 155 as they come out of the casing 111. When the wafers are held by the arms 31a and 31b thus washed and dried, therefore, they can be transferred to a next process stage without any extrapure water adhered.

When the liquid jetting means 130 is arranged between the arms 31a and 31b to jet washing liquid to them from inside, no additional space for the means 130 is needed in the casing 111. This contributes to space saving in the casing 111. Further, extrapure water is jetted from a nearer point to the grooves P and Q of the rods 35 and 36 which are most easily contaminated. Therefore, the arms 31a and 31b can be cleaned by extrapure water jetted at a lower jetting pressure (1 Kg/cm$^2$ G, for example). The amount of extrapure water used can be thus saved. Furthermore, extrapure water is jetted obliquely and downward to the arms 31a and 31b. Washing solution or agent and particles adhering to them, therefore, can be surely blown out downward by the downward flow of extrapure water jetted. Extrapure water can be thus more easily removed from them to shorten the arms washing time.

When the arms 31a and 31b are to be dried, dry air is jetted obliquely and downward through the gas jetting apertures 143 of the gas jetting means 140. The removing of extrapure water from the arms 31a and 31b which have been washed by extrapure water can be thus made faster by the down flow of dry air to shorten the arms drying time. Further, dry air is concentratedly jetted to the grooves-provided portions of the rods 35 and 36 in which water is likely to stay, while a smaller amount of dry air is Jetted to the vertical rods 33 and 34 which are smooth in surface. The number of the gas jetting apertures can be thus made smaller. When it is made smaller, the pressure of jetting dry air through the gas jetting apertures, 143 can be made proportionally higher and the cost needed to form the apertures 143 in the gas pipes or to make the gas jetting means 140 can be made lower. When dry air is concentratedly jetted to some portions needed, the drying efficiency can be made higher to shorten the arms drying time, too.

Figure 13:
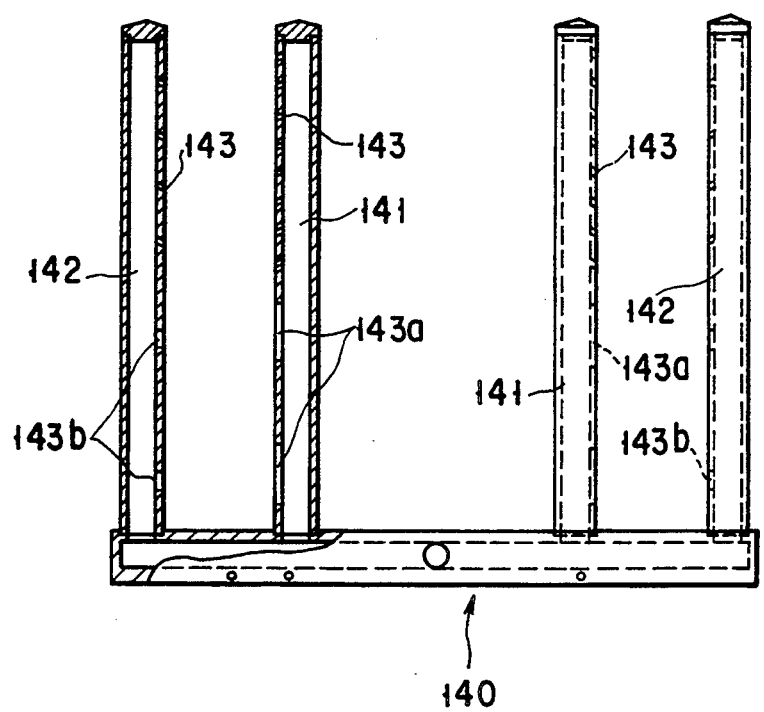
FIG. 13 is a sectional front view showing a variation of the gas supply means for the chuck cleansing section shown in FIG. 9.
Figure 14:
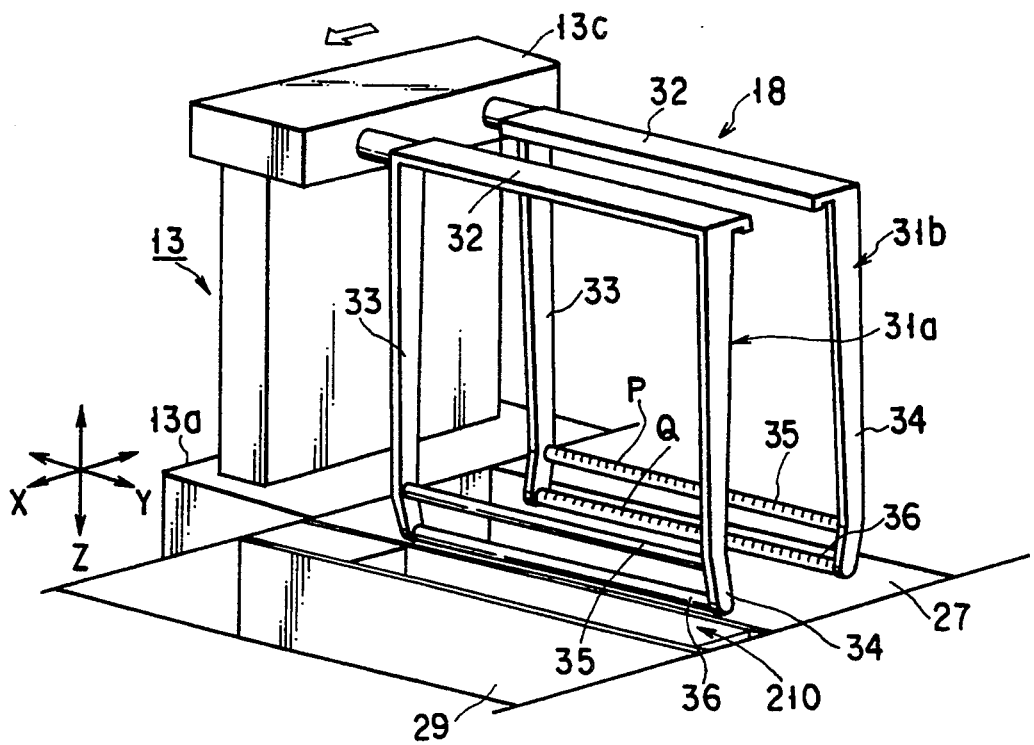
FIG. 14 is a perspective view showing a chuck cleaning section according to a third embodiment of the present invention.

FIG. 13 shows a variation of the gas jetting means 140. A gas jetting slit 143a is formed in two areas of each inner gas pipe 141 instead of the densely-arranged apertures 143 in the gas jetting means 140 shown in FIG. 11. In addition, a gas jetting slit 143b is formed in two areas of each outer gas pipe 142 instead of the densely-arranged apertures 143 in the gas jetting means 140 shown in FIG. 11. When these gas jetting slits 143a and 143b are used, the number of the gas jetting apertures can be reduced to a greater extent and the gas jetting means cost can be made lower, while keeping the cleaning efficiency high or unchanged.

The chuck cleaning apparatus according to a third embodiment of the present invention will be described referring to FIGS. 14 through 20. This third chuck is also incorporated, as a wafer chuck cleaning section, into the cleaning system 1 shown in FIG. 1.

As shown in FIGS. 18 and 19, the chuck cleaning section 210 includes an outer casing 241 and an inner casing 242 slidably housed and moved up and down by a drive unit (not shown) in the outer casing 241. The casing 242 is open at the top and bottom thereof. Various kinds of motor can be used as the drive unit. In order to move the inner casing 242 up and down in the outer casing 241, for example, a bracket 243 is fixed to a side of the inner casing 242 and a block 244a attached to the inner casing 242 through the bracket 243 or shafts 244 is moved up and down by a screw shaft. Or a timing belt can be used. Or an air cylinder can be used. Considering atmosphere in the cleaning system 1, it is preferable that these drive and transmission mechanisms are kept air-tight outside the outer casing 241.

A pair of gas sprays 251, opposite to each other, run along inner top ends of longitudinal side plates 245 and 246 of the inner casing 242. A pair of liquid sprays 261, opposite to each other and positioned a little lower than the gas sprays 251, also run along inner faces of the side plates 245 and 246. The inner casing 242 has such a space therein that allows washing and drying to be achieved relative to the arm 31a or 31b without causing the gas and liquid sprays 251 and 261 to interfere with the arm 31 when it is positioned in the inner casing 242.

Each gas spray 251 has a pipe body 252 which is closed at both ends thereof. A plurality of apertures GN (60 units, for example: $GN_1$–$GN_{60}$) are arranged along the spray body 252 at a certain interval. Dry air or inert gas ($N_2$, for example) is supplied into the spray body 252 through one end thereof via a flexible tube 254 and a supply pipe 255 and sprayed into the inner casing 242 through the apertures GN.

Each liquid spray 261 has a pipe body 262 which is closed at both ends thereof. A plurality of nozzles LN are attached along the spray body 262. Washing or cleaning liquid such as pure water is supplied into the spray body 262 through an opening at the center thereof via a flexible tube 264 and a supply pipe 265 and sprayed radially into the inner casing 242 through the nozzles LN.

As apparent from a gas spray 251A shown in FIG. 20, all of the gas jetting apertures $GN_1$–$GN_{60}$ may be tilted relative to the spray body 252. Or it may be arranged, as seen in the case of a gas spray 251B shown in FIG. 21, that the gas jetting apertures $GN_1$–$GN_{57}$ are tilted relative to the spray body 252, that the aperture $GN_{58}$ is made perpendicular to the spray body 252, and that the remaining apertures $GN_{59}$ and $GN_{60}$ are tilted relative to the spray body 252 in a direction reverse to the direction in which the apertures $GN_1$–$GN_{57}$ are tilted. Or it may be arranged, as seen in the case of a gas spray 251C shown in FIG. 22, that the apertures $GN_1$ and $GN_2$ adjacent to one end of the spray body 252 are tilted, that the apertures $GN_{59}$ and $GN_{60}$ adjacent to the other end of the spray body 252 are also tilted in a direction reverse to the direction in which the apertures $GN_1$ and $GN_2$ are tilted, and that the remaining apertures $GN_3$–$GN_{58}$ are made perpendicular to the spray body 252. Or they may be arranged as seen in the case of the pipes 66a and 68a shown in FIG. 7.

Although the gas jetting apertures GN have an angle in a horizontal plane in any of the above-mentioned cases, they may be tilted downward in a vertical plane. When they are arranged as described above, liquid can be quickly and easily removed from the wafer chuck.

It will be described how the chuck cleaning apparatus according to the third embodiment is operated in the chuck cleaning section 210.

Figure 15:
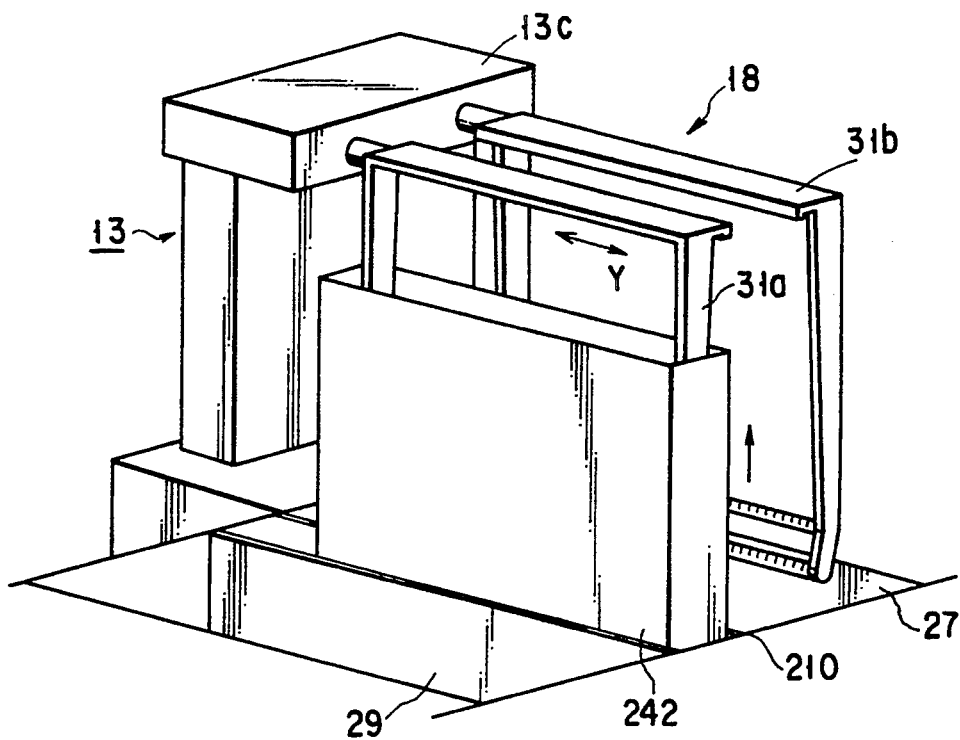
FIGS. 15, 16 and 17 are perspective views showing how the chuck cleaning section of FIG. 14 is operated.

The conveyor robot 13 is driven and the arm 31a of the wafer chuck 18 is thus positioned just above the inner casing 242 in the chuck cleaning section 210. The inner casing 242 is then lifted by the drive unit to house the arm 31a therein, as shown in FIG. 15.

The washing liquid is sprayed to the arm 31a through the nozzles LN of the paired liquid sprays 261. The arm 31a may be reciprocated in the direction Y by the drive member 13c of the conveyor robot 13, as shown in FIG. 15. The washing liquid is sprayed to the arm 31a in all directions in this case and extremely excellent washing or cleaning effect can be attained.

The inner casing 242 is then lowered while spraying the washing liquid to the arm 31a through the nozzles LN. The liquid sprays 261 run along the vertical rods 33 and 34 of the arm 31a in this while to wash or clean them together with the horizontal rods 35 36 thereof. The arm 31a may be reciprocated in the direction Y while lowering the inner casing 242. The arm 31a can be more effectively cleaned in this case.

When the washing process is finished while spraying washing liquid to the arm 31a through the liquid sprays 261, the inner casing 242 is again lifted. Dry air is sprayed this time to the arm 31a through the apertures GN of the paired gas sprays 251. When the arm 31a is reciprocated in the direction Y in this case, too, dry air can be sprayed to the arm 31a in all directions. Washing liquid drops adhering to the surface of the arm 31a can be thus blown out from it by dry air jetted to thereby more effectively dry it. The arm drying time can be shortened accordingly.

When the inner casing 242 is lowered while spraying dry air through the gas Jetting apertures GN, the gas sprays 251 run along the vertical rods 33 and 34 of the arm 31a in this while to dry them together with the horizontal rods 35 and 36 thereof. The arm 31a may be reciprocated in the direction Y in this case, too, to more effectively dry the arm 31a.

Figure 16:
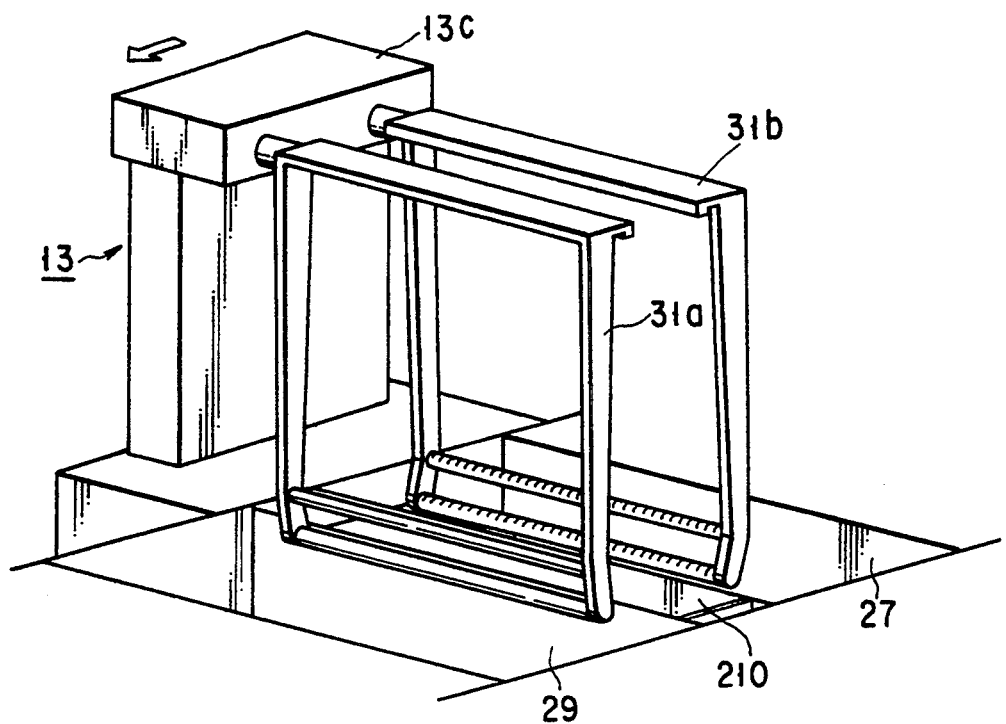

Washing and drying are finished relative to the arm 31a, the other arm 31b is positioned just above the inner casing 242 by the conveyor robot 13, as shown in FIG. 16.

Figure 17:
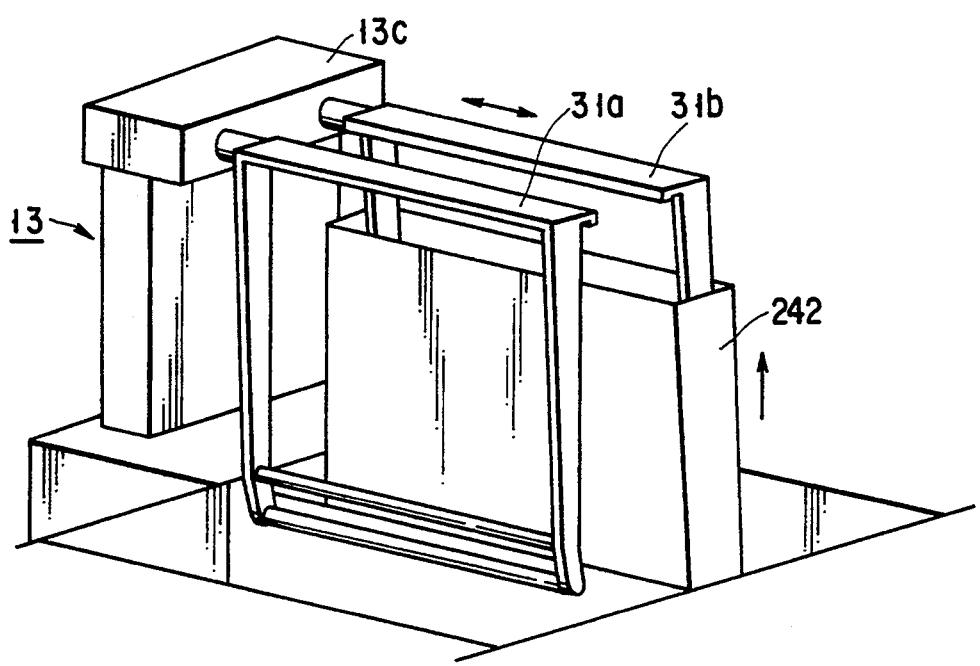

As seen in the case of the arm 31a cleaned and dried, the inner casing 242 is lifted to house the arm 31b therein, as shown an FIG. 17. The arm 31b is washed and dried in the same manner as seen in the case of the arm 31a.

When the arms 31a and 31b are alternately washed and dried in the inner casing 242 as described above, the width of the cleaning section 210 can be made half as compared with that of the conventional one. The chuck cleaning apparatus is arranged in the cleaning system 1 on the upstream side and also on the downstream side thereof. Therefore, a space which corresponds to the whole of one conventional chuck cleaning apparatus can be saved in the cleaning system 1. In addition, washing liquid and dry air supply systems can be made smaller in size, as compared with the conventional case where two arms are washed and dried at the same time. This enables the whole of the cleaning system 1 to be made smaller in size.

It is desirable that atmosphere in the wafers cleaning unit 3 in the cleaning system 1 is shielded from those in other zones to prevent the wafers and others in the unit 3 from being contaminated by floating particles. In the case of the third embodiment of the present invention, the chuck cleaning sections 210 are arranged at both ends of the cleaning unit 3. When their inner casings 242 are lifted, therefore, these casings 242 can serve as walls for shielding atmosphere in the unit 3 from those in other zones.

When the inner casing 242 is made of transparent material such as acryl, washing and drying which are applied to the arm in the inner casing 242 can be viewed.

When the arms 31a and 31b are alternately washed and dried in the inner casing 242, they can be reciprocated in the direction Y while lowering the inner casing 242. In short, they can be washed and dried an zigzag manner. This zigzag manner will make its program complicated if it is realized in the conventional chuck cleaning apparatus, taking the conveyor robot into consideration. In the case of the third embodiment of the present invention, however, it can be more easily realized and more effective washing and drying can be thus applied to the arms 31a and 31b. They may be moved only in one direction in this case.

Although the above-described chuck is intended to convey semiconductor wafers, the present invention can be applied to the other chucks for conveying LCD glass substrates and others. Further, liquid and gas supplying and jetting means can be made of those materials which create no dust and which are resistant to erosion.

What is claimed is:

1. An apparatus for cleaning a conveyor chuck which includes first and second arms each having a lower traverse rod provided with a plurality of grooves for holding a plurality of plate objects at intervals in an erected state and also having an erect rod supporting the traverse rod, said apparatus comprising:

elevator means for driving the conveyor chuck up and down while keeping the traverse rods of said first and second arms downward;

a casing for providing a cleaning space therein and provided with a top opening in the top thereof through which said arms can be driven into and out of the cleaning space in the casing by the elevator means;

first and second rows of discharge ports arranged between the arms in the casing and kept substantially horizontal to jet washing liquid to the first and second arms at first and second levels, respectively;

means for supplying washing liquid to the first and second rows of discharge ports;

third and fourth rows of discharge ports arranged between the arms in the casing and kept substantially horizontal to jet drying gas to the first and second arms at third and fourth levels above the first and second levels, respectively; and means for supplying drying gas to the third and fourth rows of discharge ports;

wherein each of said third and fourth rows of discharge ports is divided into a first group positioned over the erect rod of each arm in a horizontal direction to be dedicated to said erect rod, and a second group to be dedicated to the traverse rod of said arm, said first group of discharge ports being inclined downward in a vertical plane and directed to substantially converge toward said erect rod in a horizontal plane, and said second group of discharge ports being inclined downward in a vertical plane and directed substantially perpendicular to said traverse rod.

2. The chuck cleaning apparatus according to claim 1, wherein said means for supplying washing liquid includes a first pipe element having the first row of discharge ports and a second pipe element having the second row of discharge ports.

3. The chuck cleaning apparatus according to claim 2, wherein said means for supplying drying gas includes a third pipe element having the third row of discharge ports and a fourth pipe element having the fourth row of discharge ports.

4. The chuck cleaning apparatus according to claim 3, wherein said casing has an exhaust port which is positioned lower than a lower end position to which the first and second arms are lowered into the cleaning space in the casing.

5. The chuck cleaning apparatus according to claim 4, wherein said casing is divided into first and second compartments by a partition plate and said top opening comprises first and second parts through which the first and second arms are driven into and out of the first and second compartments, respectively.

6. The chuck cleaning apparatus according to claim 5, wherein said first and second pipe elements comprise one pipe incorporated with the partition plate.

7. The chuck cleaning apparatus according to claim 6, wherein said third and fourth pipe elements comprise pipes arranged, independently of the other, in the first and second compartment.

8. The chuck cleaning apparatus according to claim 7, further comprising means for horizontally reciprocating the conveyor chuck in the longitudinal direction of the traverse rods, wherein said conveyor chuck is supported by the elevator means through the means for horizontally reciprocating.

9. An apparatus for cleaning a conveyor chuck which includes first and second arms each having a lower traverse rod provided with a plurality of grooves for holding a plurality of plate objects at intervals in an erected state and also having an erect rod supporting the traverse rod, said apparatus comprising:

elevator means for driving the conveyor chuck up and down while keeping the traverse rods of said first and second arms downward;

a casing for providing a cleaning space therein and provided with a top opening in the top thereof through which said arms can be driven into and out of the cleaning space in the casing by the elevator means;

first and second rows of discharge ports arranged between the arms in the casing and kept substantially horizontal to jet washing liquid to the first and second arms at first and second levels respectively;

means for supplying washing liquid to the first and second rows of discharge ports;

third and fourth rows of discharge ports arranged between the arms in the casing and kept substantially horizontal to jet drying gas to the first and second arms at third and fourth levels above the first and second levels, respectively;

fifth and sixth rows of discharge ports arranged outside the arms in the casing and kept substantially horizontal to jet drying gas to the first and second arms at fifth and sixth levels above the first and second levels, respectively; and means for supplying drying gas to the third, fourth, fifth and sixth rows of discharge ports;

wherein each of said third, fourth, fifth and sixth rows of discharge ports is divided into a first group positioned over the erect rod of each arm in a horizontal direction to be dedicated to said erect rod, and a second group to be dedicated to the traverse rod of said arm, said first group of discharge ports being inclined downward in a vertical plane and directed to substantially converge toward said erect rod in a horizontal plane, and said second group of discharge ports being inclined downward in a vertical plane and directed substantially perpendicular to said traverse rod.

10. The chuck cleaning apparatus according to claim 9, wherein said fifth and sixth levels are substantially the same as the third and fourth levels.

11. The chuck cleaning apparatus according to claim 9, wherein said means for supplying washing liquid includes a first pipe element having the first row of discharge ports and a second pipe element having the second row of discharge ports.

12. The chuck cleaning apparatus according to claim 11, wherein said means for supplying drying gas includes a third pipe element having the third row of discharge ports, a fourth pipe element having the fourth row of discharge ports, a fifth pipe element having the fifth row of discharge ports, and a sixth pipe element having the sixth row of discharge ports.

13. The chuck cleaning apparatus according to claim 12, wherein said casing has an exhaust port which is positioned lower than a lower end position to which the first and second arms are driven into the cleaning space in the casing.

14. The chuck cleaning apparatus according to claim 13, wherein said casing is divided into first and second compartments by a partition plate and said top opening comprises first and second parts through which the first and second arms are driven into and out of the first and second compartments, respectively.

15. The chuck cleaning apparatus according to claim 14, wherein said fifth and sixth pipe elements comprise pipes arranged, independently of the other, in the first and second compartments.

16. The chuck cleaning apparatus according to claim 15, wherein said first and second pipe elements comprise one pipe incorporated with the partition plate.

17. The chuck cleaning apparatus according to claim 16, wherein said third and fourth pipe elements comprise pipes arranged, independently of the other, in the first and second compartments.

18. The chuck cleaning apparatus according to claim 17, further comprising means for horizontally reciprocating the conveyor chuck in the longitudinal direction of the traverse rods, wherein said conveyor chuck is supported by the elevator means through the means for horizontally reciprocating.

19. A system for cleaning a plurality of plate objects together comprising:

a) a loader section into which a carrier housing therein a plurality of the objects to be processed is transferred;

b) a chemical washing section for washing a plurality of the objects together by a chemical solution;

c) a water washing section for washing said plurality of the objects together by water after they are washed in the chemical washing section;

d) a drying section for drying said plurality of the objects together after they are washed in the water washing section;

e) an unloader section from which a carrier housing therein a plurality of the objects which have been cleaned is transferred;

f) a unit for conveying the objects between at least some of the loader, chemical washing, water washing, drying and unloader sections, said unit comprising a conveyor chuck which includes first and second arms each having a lower traverse rod provided with a plurality of grooves for holding a plurality of the objects at intervals in an erected state and also having an erect rod supporting the traverse rod, and elevator means for driving the conveyor chuck up and down while keeping the traverse rods of the first and second arms downward; and g) an apparatus for cleaning the conveyor chuck comprising a casing for providing a cleaning space therein and provided with a top opening in the top thereof through which said arms can be driven into and out of the cleaning space in the casing by the elevator means, first and second rows of discharge ports arranged between the arms in the casing and kept substantially horizontal to jet washing liquid to the first and second arms at first and second levels, respectively means for supplying washing liquid to the first and second rows of discharge ports, third and fourth rows of discharge ports arranged between arms in the casing and kept substantially horizontal to jet drying gas to the first and second arms at third and fourth levels above the first and second levels, respectively, and means for supplying drying gas to the third and fourth rows of discharge ports, wherein each of said third and fourth rows of discharge ports is divided into a first group positioned over the erect rod of each arm in a horizontal direction to be dedicated to said erect rod, and a second group to be dedicated to the traverse rod of said arm, said first group of discharge ports being inclined downward in a vertical plane and directed to substantially converge toward said erect rod in a horizontal plane, and said second group of discharge ports being inclined downward in a vertical plane and directed substantially perpendicular to said traverse rod.

20. A system for cleaning a plurality of plate objects together comprising:
a) a loader section into which a carrier housing therein a plurality of the objects to be processed is transferred;
b) a chemical washing section for washing a plurality of the objects together by a chemical solution;
c) a water washing section for washing said plurality of the objects together by water after they are washed in the chemical washing section;
d) a drying section for drying said plurality of the objects together after they are washed in the water washing section;
e) an unloader section from which a carrier housing therein a plurality of the objects which have been cleaned is transferred;
f) a unit for conveying the objects between at least some of the loader, chemical washing, water washing, drying and unloader sections, said unit comprising
a conveyor chuck which includes first and second arms each having a lower traverse rod provided with a plurality of grooves for holding a plurality of the objects at intervals in an elected state and also having an erect rod supporting the traverse rod, and
elevator means for driving the conveyor chuck up and down while keeping the traverse rods of the first and second arms downward; and
g) an apparatus for cleaning the conveyor chuck comprising
a casing for providing a cleaning space therein and provided with a top opening in the top thereof through which said arms can be driven into and out of the cleaning space in the casing by the elevator means,
first and second rows of discharge ports arranged between the arms in the casing and kept substantially horizontal to jet washing liquid to the first and second arms at first and second levels, respectively,
means for supplying washing liquid to the first and second rows of discharge ports,
third and fourth rows of discharge ports arranged between the arms in the casing and kept substantially horizontal to jet drying gas to the first and second arms at third and fourth levels above the first and second levels, respectively,
fifth and sixth rows of discharge ports arranged outside the arms in the casing and kept substantially horizontal to jet drying gas to the first and second arms at fifth and sixth levels above the first and second levels, respectively, and
means for supplying drying gas to the third, fourth, fifth and sixth rows of discharge ports,
wherein each of said third, fourth, fifth and sixth rows of discharge ports is divided into a first group positioned over the erect rod of each arm in a horizontal direction to be dedicated to said erect rod, and a second group to be dedicated to the traverse rod of said arm, said first group of discharge ports being inclined downward in a vertical plane and directed to substantially converge toward said erect rod in a horizontal plane, and said second group of discharge ports being inclined downward in a vertical plane and directed substantially perpendicular to said traverse rod.

* * * * *